United States Patent
Hsiao et al.

(10) Patent No.: US 6,986,082 B2
(45) Date of Patent: Jan. 10, 2006

(54) TESTING SYSTEM FOR SEMICONDUCTOR MEMORY DEVICE

(75) Inventors: Kun-Ti Hsiao, Taipei (TW); Hao-Liang Lo, Hsinchu (TW); Li-Yang Yang, Tainan Hsien (TW)

(73) Assignee: Winbond Electronics Corp., Hsinchu (TW)

( * ) Notice: Subject to any disclaimer, the term of this patent is extended or adjusted under 35 U.S.C. 154(b) by 175 days.

(21) Appl. No.: 09/895,559

(22) Filed: Jun. 28, 2001

(65) Prior Publication Data

US 2003/0005372 A1 Jan. 2, 2003

(51) Int. Cl.
*G11C 29/00* (2006.01)
*G01R 31/26* (2006.01)

(52) U.S. Cl. .............. 714/718; 365/201; 324/763; 324/765

(58) Field of Classification Search ............... 714/718, 714/751, 748; 324/763, 765; 365/201
See application file for complete search history.

*Primary Examiner*—Albert Decady
*Assistant Examiner*—Esaw Abraham
(74) *Attorney, Agent, or Firm*—J. C Patents

(57) ABSTRACT

A testing architecture for a semiconductor memory device is described. The testing architecture comprises a microprocessor, as well as a result sorting and display device. When a start signal is received by the microprocessor, a clock signal is output from the microprocessor to the semiconductor memory device so that a data storing signal is output from the memory device to the microprocessor. When the data storing signal is received by the microprocessor, the data storing signal is tested and compared, and a testing result signal is output. The resorting and display device is used to output the start signal to the microprocessor, receive the result signal, and sort the result signal so as to display whether data stored by the semiconductor memory device is correct.

3 Claims, 5 Drawing Sheets

TESTING SYSTEM FOR SEMICONDUCTOR MEMORY DEVICE

BACKGROUND OF THE INVENTION

The present invention relates to a testing architecture for a semiconductor memory device. More particularly, the present invention relates to a testing architecture for a semiconductor memory device with serial data outputs.

DESCRIPTION OF THE RELATED ART

A semiconductor memory device with serial data outputs, for example, an electrically erasable programmable ROM (EPROM) broadly used in computer and electronic industry, is commonly tested after the memory device is finished to check whether the memory device performs an expected function or manifests a malfunction.

Currently, several kinds of semiconductor memory devices are available with multifunction to reach the requirement of the device tests. However, some devices which need high level tests are expensive. This causes a lot of capital expenditure. Therefore, a high testing performance and low cost testing architecture using a personal computer has been developed. As shown in FIGS. 1A and 1B, a personal computer 20 is connected with a buffer and a serial-to-parallel converter to form a testing architecture.

The testing architecture 100 comprises a serial-input-parallel-output (SIPO) device 110, a buffer 120 (such as a memory of a personal computer), and a tester 130 (such the CPU and display of a personal computer). While activating the testing architecture 100, a starting clock signal with 8 clocks is in sequence output from the tester 130 and is transmitted to a device under test (DUT) 10 and the SIPO 110 through line 132 (here a clock signal with 8 clocks is taken as an example). At this time, according to the data stored in the DUT 10 and the s clock starting signal, a storing signal with 8 clocks is output in series from the DUT 10 and is transmitted to the SIPO 110 through line 12. The serial storing signal with 8 clocks is converted into a parallel signal by the SIPO 110. Then the parallel signal is output to the buffer 120 through bus 112.

Before the tester 10 starts testing, a stop signal is transmitted to the DUT 130 through line 132 to stop transmitting data to the SIPO 110. This is called a hardware time delay. The time delay can benefit the testing process. An access signal output from the tester 130 is transmitted to the buffer 120 through line 134. The 8 bits of data stored in the buffer 120 is transmitted to the tester 130 through bus 122.

In order to describe the testing architecture in detail, reference is made to FIGS. 2A, 2B and 1A, 1B. FIG. 2A is a timing sequence of the start signal output through the conventional testing architecture in FIGS. 1A and 1B. FIG. 2B is a testing flow chart of the conventional testing architecture. In step S10, the start clock signal is transmitted in sequence to the DUT 10 and the SIPO 110 by the tester to drive the DUT 10 to transmit the data in series to the SIPO 110. The corresponding time interval is t1, as seen in FIG. 2A. In time interval t1 of step S11, 8 bits of the serial starting clock signal is converted into a parallel signal, and then the parallel signal is transmitted to the buffer 120. In step S12, that is, in corresponding time interval a in FIG. 2A, a stop signal is transmitted from the tester 130 to the DUT 10 to stop relaying the data to the SIPO 110. This is a kind of hardware time delay. The time delay can benefit the testing process.

In step S13, that is, in corresponding time interval t3 in FIG. 2A, an access signal is transmitted from the tester 130 to the buffer 120. The parallel form 8 bits of data stored in the buffer 120 are transmitted to the tester 130. In S14, the 8 bits of data are tested, compared, and result sorted by the tester 130. A testing result is obtained.

Using the testing architecture in FIG. 1B, after the data stored in the DUT 10 is accessed, the serial-to-parallel operation, the buffer driving operation to access the data, and the delay time added for avoiding data overflow are performed. This causes an increase in testing time. Moreover, if the CPU of the personal computer is used to access, compare, and result sort the data, the testing architecture causes a waste of time with regard to the temporal non-availability of the CPU. Thus, it takes a lot of time to finish the device tests, and the capital expenditure is increased.

SUMMARY OF THE INVENTION

The invention provides a testing architecture for a semiconductor memory device. The testing architecture is used for testing the semiconductor memory device. The testing architecture comprises a microprocessor, as well as a result sorting and display device. When a start signal is received by the microprocessor, a clock signal is output from the microprocessor and transmitted to the semiconductor memory device so that a data storing signal is output from the semiconductor memory device to the microprocessor. When the data storing signal is received by the microprocessor, the data storing signal is tested and compared, and a testing result signal is output. The resorting and display device is used to output the start signal to the microprocessor, to receive the result signal, and to sort the result signal so as to display whether data stored by the semiconductor memory device are correct.

The invention provides a testing architecture for a semiconductor memory device. The testing architecture is used for testing the semiconductor memory device. The testing architecture comprises a microprocessor, as well as a result sorting and display device. When a start signal is received by the microprocessor, a clock signal is output from the microprocessor and transmitted to the semiconductor memory device so as to output a data storing signal in series from the semiconductor memory device to the microprocessor. When the data storing signal is received in series by the microprocessor, the data storing signal is tested, compared, and a testing result is output through a result signal. The result sorting and display device is used to output the start signal to the microprocessor, receive the result signal, and sort the result signal so as to display whether data stored by the semiconductor memory device are correct.

Accordingly, the invention can avoid the serial-to-parallel operation, the operation of driving the buffer to access the data, and the delay time added for avoiding the data overflow, necessarily performed in the conventional testing architecture.

Additionally, the invention can use a personal computer with low cost to test the semiconductor memory device. Therefore, the capital expenditure is decreased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
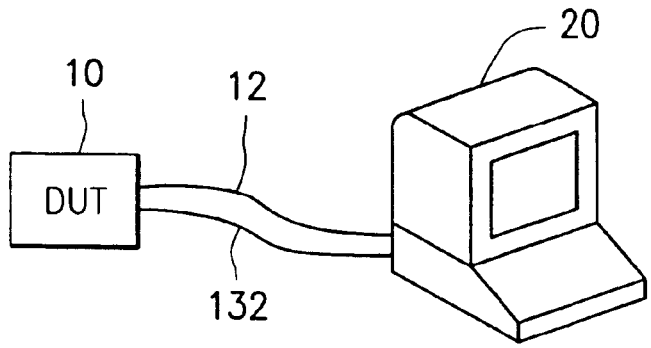
FIGS. 1A and 1B show a conventional testing architecture for a semiconductor memory device.

Reference will now be made in detail to the present preferred embodiments of the invention, examples of which are illustrated in the accompanying drawings. Wherever possible, the same reference numbers are used in the drawings and the description to refer to the same or like parts.

Figure 3:
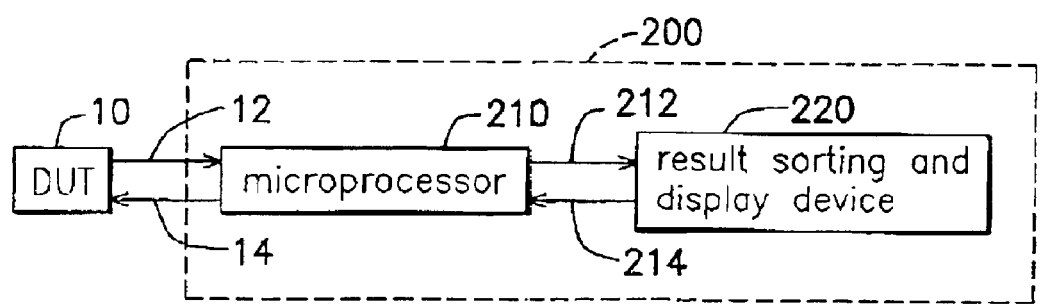
FIG. 3 is a block diagram for a testing architecture of a semiconductor memory device according to one preferred embodiment of this invention.

FIG. 3 is a block diagram for a testing architecture 200 of a semiconductor memory device according to one preferred embodiment of this invention. The testing architecture 200 comprises a microprocessor 210, as well as a result sorting and display device 220. The microprocessor 210 is used to receive a serial data output from a semiconductor memory device (called a device under test). When the serial data is received by the microprocessor 210, the data is tested and compared. The microprocessor 210 includes, for example, an 8051 integrated circuit (IC) having a fast 10 calculation function.

While starting to test a device under test (DUT) 10, a start signal is output by the result sorting and display device 220, and then transmitted to the microprocessor 210 through line 214. A clock signal is output from the microprocessor 210 to the DUT 10 through line 14. When the clock signal is received by the DUT 10, stored data is output. In general, if 8 bits of data are tested, signals with 8 clocks are transmitted in sequence from the microprocessor 210. Here, the 8 clock signals are just an example. Different bits of data can be tested by the invention.

While the microprocessor 210 receives data, for example, 8 bits of data, transmitted from the DUT 10 through line 12, the data is tested and compared by the microprocessor 210. A testing result signal is obtained by the microprocessor 210, and then transmitted to the result sorting and display device 220 through line 212. When the testing result signal is received by the result sorting and display device 220, the testing result signal is sorted and a result is displayed so that the operators can distinguish whether the DUT 10 is correct.

Figure 4A:
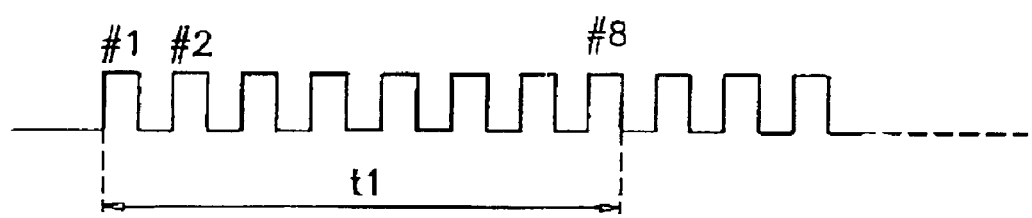
FIG. 4A is a timing sequence of the clocks output from the microprocessor 210.
Figure 4B:
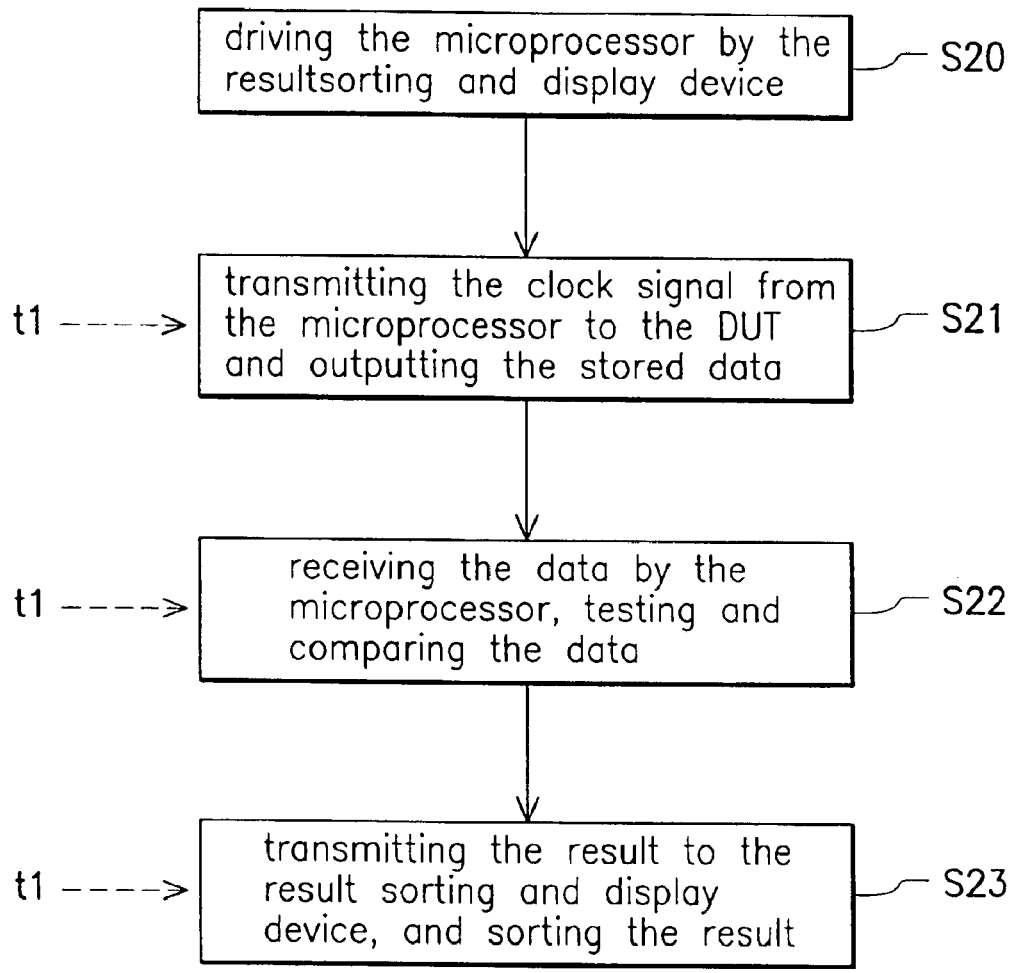
FIG. 4B is a testing flow chart of the preferred embodiment of the invention.

In order to describe the preferred embodiment of the invention in detail, please refer to FIGS. 4A, 4B and 3. FIG. 4A is a timing sequence of the clocks output from the microprocessor 210. FIG. 4B is a testing flow chart of the preferred embodiment of the invention. In step 520, the test-starting signal is output from the result sorting and display device 220 to the microprocessor 210. In time interval t1 in FIG. 4A, the clocks #1, #2, #3 . . . are output in sequence from the microprocessor 210 to the DUT 10, and the corresponding stored data is then transmitted in series from the DUT 10 to the microprocessor 210 (step S21). Here the 8 bits of data are taken as an example; therefore, there are 8 clocks in time interval t1.

In the time interval t1, serial data output from a semiconductor memory device can be received, tested and compared by the microprocessor 210 (step S22). Therefore, data such as 8 bits of data output from the DUT 10 are tested and compared by the microprocessor 210. In time interval t1, the tested and compared results are transmitted to the result and display device 220 by the microprocessor 210, and after the tested and compared results are received by the result sorting and display device 220, the tested results are sorted by the result sorting and display device 220 (step S23). Moreover, a sorted result is displayed for the benefit of the operators checking the DUT 10.

Figure 1B:
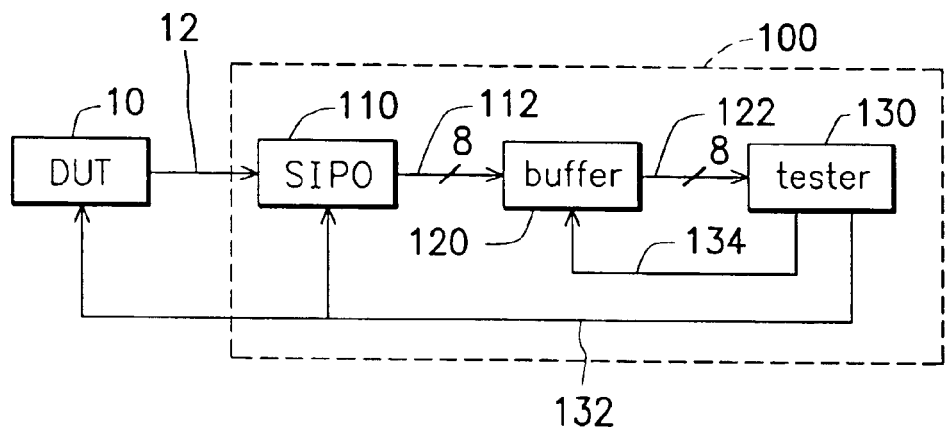
Figure 2A:
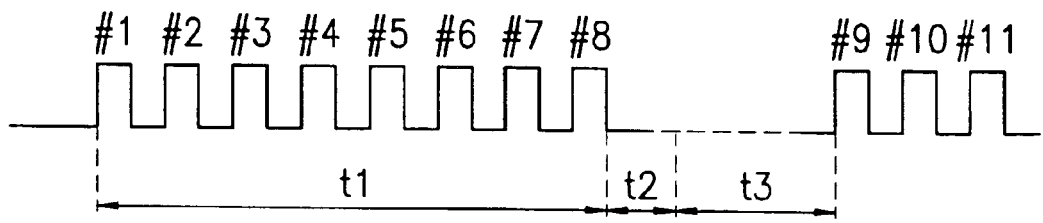
FIG. 2A is a timing sequence of the start signal output through the testing architecture in FIGS. 1A and 1B.
Figure 2B:
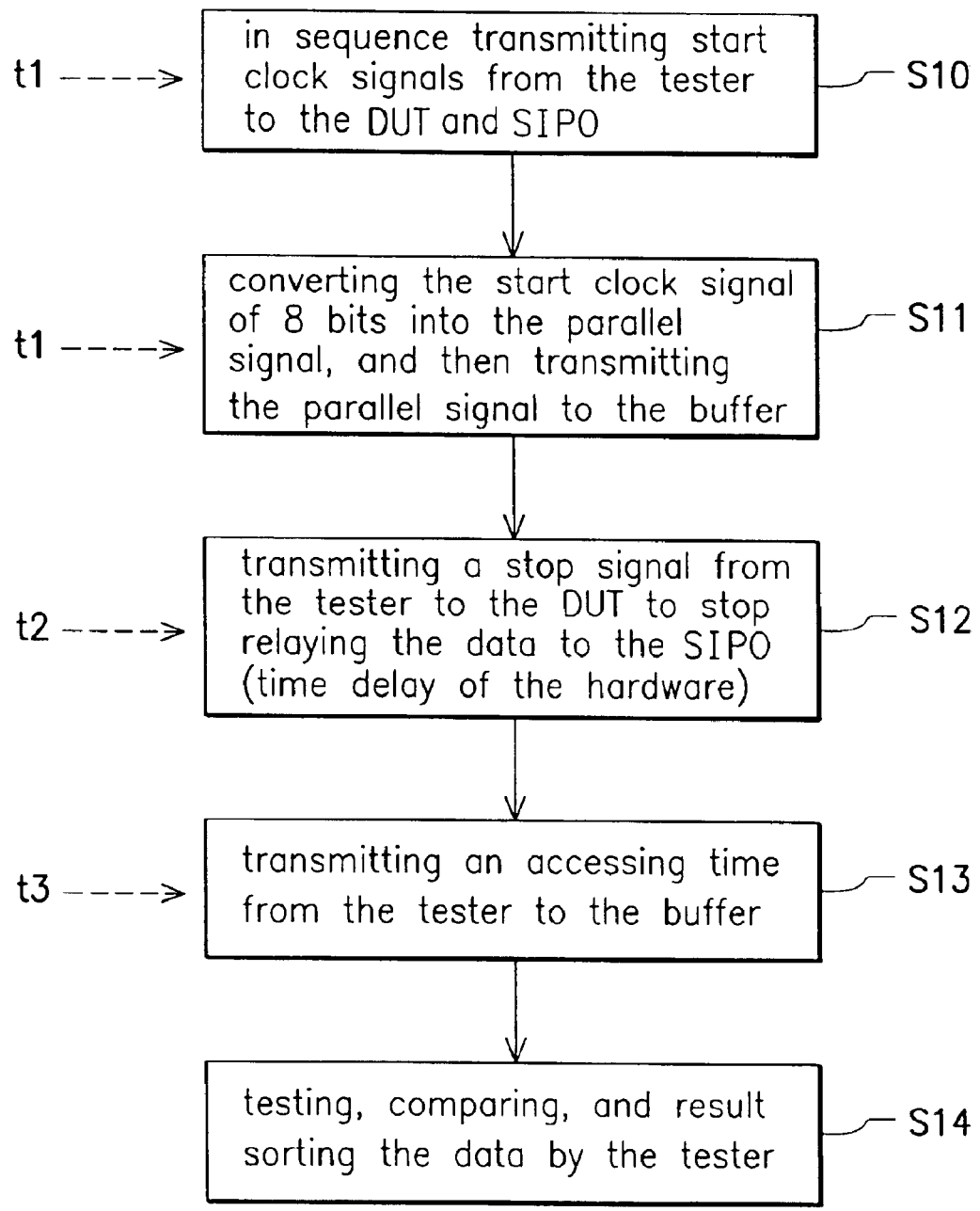
FIG. 2B is a testing flow chart of the conventional testing architecture.

In the conventional testing architecture of a semiconductor memory device, a time interval t2 and a time interval t3 are needed, as shown in FIG. 2A. The time interval t2 is a delay time for the testing architecture 130 in FIG. 1 to make the DUT 10 stop transmitting data to the buffer 120. The time interval t3 is a time for the testing architecture 130 in FIG. 1 to activate the buffer 120 to transmit the data. But the invention can simultaneously finish the tested and compared operation in time interval t1. This is the greatest difference between the invention and the conventional testing architecture.

Accordingly, if a semiconductor memory device with 1M bits is tested, 1M clocks are read to test the data of the semiconductor memory device. Therefore, it takes at least $1/200$ kHz×1M bits=5 seconds if the rate for accessing data is 200 kHz. In the conventional testing architecture, at least one clock is needed while every 8 clocks are transmitted. Thus, an extra 128 K clocks (1M/X=128K) are needed. So the extra 7 seconds are needed. The accessing time is about 7 seconds. Therefore, by the conventional architecture, total duration is about 12 seconds for testing the semiconductor memory device with 1M bits. However, in the invention, the microprocessor such as an 8051 microprocessor can receive serial data and calculates quickly. The microprocessor takes just 6.5 seconds (the accessing time (5 seconds) plus the operating time (about 1.5 seconds). It is obvious that almost half the time is saved for one memory device. If a lot of memory devices are tested, a lot of time can be saved. Thus the testing performance is increased. Moreover, the capital expenditure can also be reduced.

Figure 5:
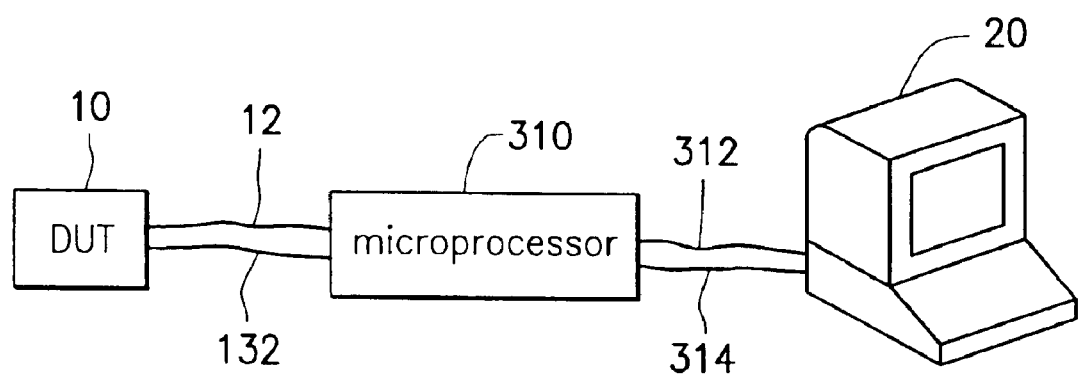
FIG. 5 shows a testing architecture for a semiconductor memory device according to the preferred embodiment of the invention.

FIG. 5 shows a testing architecture of a semiconductor memory device according to the preferred embodiment of the invention. A microprocessor 310 such as an 8051 microprocessor with fast operation is connected to a personal computer 20. Thus, after the data stored in the DUT 10 are accessed, the serial-to-parallel operation, the operation of driving the buffer to access the data, and the delay time added for avoiding the data overflow are not needed. The invention does not need the CPU of the personal computer to access, compare, and result sort the data. Therefore, the testing architecture of the invention avoids wasting time regarding the temporal non-availability of the CPU. In the invention, a low cost computer such as a personal computer can be used to test the semiconductor memory device so as to decrease capital expenditure and increase performance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A testing system for a semiconductor memory device, used for testing the semiconductor memory device, the testing system comprising:
    a microprocessor, wherein when a start signal is received by the microprocessor, a clock signal is output from the microprocessor and transmitted to the semiconductor memory device so that a data storing signal is output from the semiconductor memory device to the microprocessor, wherein when the data storing signal is received, the data storing signal is tested and compared by the microprocessor, and a testing result signal is output; and
    a result sorting and display device, used to output the start signal to the microprocessor, receive the result signal, and sort the result signal so as to display whether data stored by the semiconductor memory device is correct,
    wherein, the data storing signal is tested and compared by the microprocessor simultaneously in a time interval allocated for the clock signal being transmitted from the microprocessor to the semiconductor memory device.

2. The testing system according to claim 1, wherein the microprocessor has a function of receiving serial data, and testing and comparing the data.

3. A testing system for a semiconductor memory device, used for testing the semiconductor memory device, the testing system comprising:
    a microprocessor, wherein when a start signal is received by the microprocessor, a clock signal is output from the microprocessor and transmitted to the semiconductor memory device so as to output a data storing signal in series from the semiconductor memory device to the microprocessor, wherein when the data storing signal is received in series by the microprocessor, the data storing signal is tested, compared, and a testing result is output through a result signal; and
    a result sorting and display device, used to output the start signal to the microprocessor, receive the result signal, and sort the result signal so as to display if data stored by the semiconductor memory device is correct,
    wherein, the data storing signal is tested and compared by the microprocessor simultaneously in a time interval allocated for the clock signal being transmitted from the microprocessor to the semiconductor memory device.

* * * * *